(12) United States Patent
Ishii

(10) Patent No.: US 8,029,850 B2
(45) Date of Patent: Oct. 4, 2011

(54) METHOD OF MANUFACTURING ORGANIC ELECTROLUMINESCENT DEVICE AND METHOD OF MANUFACTURING DEVICE

(75) Inventor: Ryuji Ishii, Chino (JP)

(73) Assignee: Seiko Epson Corporation, Tokyo (JP)

( * ) Notice: Subject to any disclaimer, the term of this patent is extended or adjusted under 35 U.S.C. 154(b) by 940 days.

(21) Appl. No.: 11/360,663

(22) Filed: Feb. 24, 2006

(65) Prior Publication Data

US 2006/0223221 A1    Oct. 5, 2006

(30) Foreign Application Priority Data

Mar. 29, 2005   (JP) .................... 2005-094282

(51) Int. Cl.
  *B05D 5/06*   (2006.01)
  *B05D 3/10*   (2006.01)
  *B05D 3/02*   (2006.01)
(52) U.S. Cl. .......... 427/66; 427/337; 427/379; 427/384
(58) Field of Classification Search ............... 427/66, 427/372.2, 379, 384, 337; 445/24; 428/917; 313/504
See application file for complete search history.

(56) References Cited

U.S. PATENT DOCUMENTS

| 6,630,274 | B1 | 10/2003 | Kiguchi et al. |
| 6,908,696 | B2 | 6/2005 | Imamura et al. |
| 7,070,890 | B2 | 7/2006 | Kiguchi et al. |
| 7,514,187 | B2 | 4/2009 | Kiguchi et al. |
| 2002/0041302 | A1* | 4/2002 | Okada et al. ............... 347/21 |
| 2003/0012869 | A1* | 1/2003 | Kido ............... 427/58 |
| 2004/0127666 | A1* | 7/2004 | Inbasekaran et al. .......... 528/8 |
| 2004/0225056 | A1* | 11/2004 | Spreitzer et al. .......... 524/570 |
| 2004/0247790 | A1* | 12/2004 | Moriyama ............... 427/256 |
| 2005/0003569 | A1* | 1/2005 | Seki et al. ............... 438/30 |
| 2005/0012445 | A1* | 1/2005 | Yamazaki et al. ............ 313/500 |
| 2005/0062021 | A1 | 3/2005 | Petrov et al. |
| 2005/0276910 | A1* | 12/2005 | Gupta ............... 427/66 |

FOREIGN PATENT DOCUMENTS

| JP | A-187111 | 7/2000 |
| JP | A 2002-022932 | 1/2002 |
| JP | A-2002-56980 | 2/2002 |
| JP | A-2003-142261 | 5/2003 |
| JP | A-2003-272841 | 9/2003 |
| JP | A-2005-5020 | 1/2005 |

* cited by examiner

*Primary Examiner* — James Lin
(74) *Attorney, Agent, or Firm* — Oliff & Berridge, PLC

(57) ABSTRACT

A method of manufacturing an organic electroluminescent device includes forming partition walls partitioning pixels on a substrate; subjecting a surface of each of the partition walls to a lyophobic treatment; coating a liquid composition on each of regions surrounded by the partition walls, the liquid composition obtained by dissolving and dispersing a forming material of a functional layer forming at least a portion of an organic electroluminescent element in a solvent; and drying the coated liquid composition so as to form the functional layer. In the coating of a liquid composition, a fluorine group-containing solvent which contains a fluorine group is used as a solvent.

2 Claims, 9 Drawing Sheets

| | COMPOSITION RATIO OF INK | | FILM FORMATION | x (nm) | y (nm) |
|---|---|---|---|---|---|
| | FLUORO-BENZENE | TRIMETHYL-BENZENE | | | |
| FIRST COMPARISON EXAMPLE | 0 | 10 |  | 30 | 35 |
| FIRST EMBODIMENT | 1 | 9 |  | 25 | 15 |
| SECOND EMBODIMENT | 3 | 7 |  | 10 | - |
| THIRD EMBODIMENT | 5 | 5 |  | 20 | - |
| FOURTH EMBODIMENT | 7 | 3 |  | 25 | - |

FIG. 12A
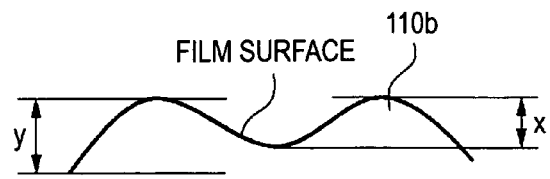
FIG. 12B
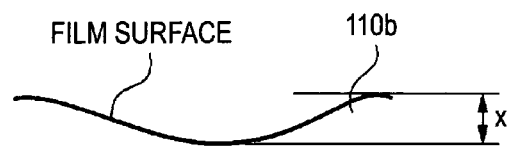
FIG. 13
| | COMPOSITION RATIO OF INK | | FILM FORMATION | x (nm) | y (nm) |
| --- | --- | --- | --- | --- | --- |
| | BENZOTRI-FLUORIDE | TRIMETHYL-BENZENE | | | |
| SECOND COMPARISON EXAMPLE | 0 | 10 | | 30 | 35 |
| FIFTH EMBODIMENT | 1 | 9 | | 10 | - |
| SIXTH EMBODIMENT | 3 | 7 | | 20 | - |

FIG. 14
| | COMPOSITION RATIO OF INK TRIMETHYL-BENZENE | SOLVENT EJECTION | FILM FORMATION | x (nm) | y (nm) |
|---|---|---|---|---|---|
| THIRD COMPARISON EXAMPLE | 10 | NONE | 110b, 112 | 30 | 35 |
| SEVENTH EMBODIMENT | 10 | YES | 110b, 112 | 20 | - |
FIG. 15
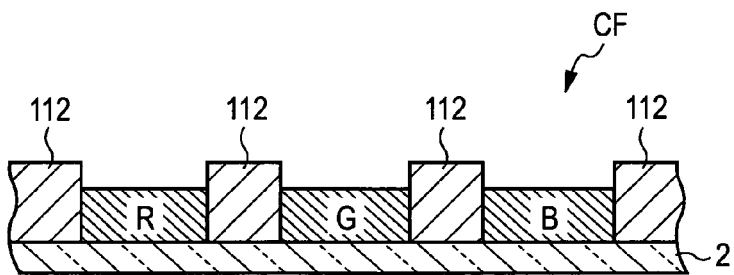
FIG. 16
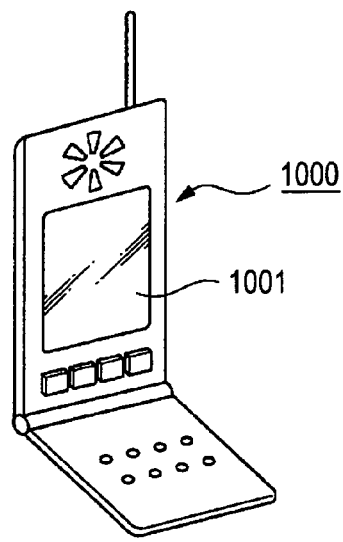

METHOD OF MANUFACTURING ORGANIC ELECTROLUMINESCENT DEVICE AND METHOD OF MANUFACTURING DEVICE

BACKGROUND

1. Technical Field

The present invention relates to a method of manufacturing an organic electroluminescent device, and to a method of manufacturing a device, such as a color filter.

2. Related Art

In recent years, a technique for manufacturing an organic electroluminescent device (hereinafter, referred to as organic EL device) by means of an inkjet method in which a light-emitting material, such as an organic fluorescent material or the like, is transformed into ink and the ink is ejected onto a substrate has been developed (for example, JP-A-2002-22932).

As disclosed in JP-A-2002-22932, when the organic EL device is manufactured using the inkjet method, banks (partition walls) are formed around pixels, and ink is ejected onto each of regions surrounded by the banks. These banks are subjected to a lyophobic treatment by means of a fluorination treatment, so that it is possible to prevent a color mixture, white voids and ink leakage from being generated, when the ink is ejected. The bank having been subjected to the fluorination treatment has an extremely high lyophobic property, so that the bank and the ink are repellent to each other. As a result, the shape of the film obtained after drying the ink may be a shape where it sags at the periphery of the pixel (near the bank) and rises at the center of the pixel or a shape where it sags at the periphery of the pixel (near the bank) and rises at the inner side, and a concave portion is formed in the pixel center portion. If it has the film shape, the flatness of the film is lowered, causing a light-emitting characteristic to be deteriorated.

SUMMARY

An advantage of some aspects of the invention is that it provides a method of manufacturing an organic EL device capable of forming a surface of a functional layer with a flat surface having small unevenness and preventing a light-emitting characteristic from being lowered, when the functional layer is formed by using an inkjet method. Another advantage of some aspects of the invention is that it provides a method of manufacturing a device such as a color filter.

According to a first aspect of the invention, there is provided a method of manufacturing an organic electroluminescent device. The method includes forming partition walls partitioning pixels on a substrate; subjecting a surface of each of the partition walls to a lyophobic treatment; coating a liquid composition on each of regions surrounded by the partition walls, the liquid composition obtained by dissolving and dispersing a forming material of a functional layer forming at least a portion of an organic EL element in a solvent; and drying the coated liquid composition so as to form the functional layer. In the coating of a liquid composition, a fluorine group-containing solvent which contains a fluorine group is used as a solvent.

According to this aspect, the organic EL device, which can form the functional layer with high flatness and has an excellent light-emitting characteristic without light-emitting irregularities, can be achieved. That is, since the liquid composition is formed by the solvent containing the fluorine group-containing solvent such that the liquid composition does not have an extreme lyophobic property with respect to the partition walls having been subjected to the lyophobic treatment, the functional layer formed by coating and drying the liquid composition has high flatness. Specifically, the functional layer, which is formed of the liquid composition containing the fluorine group-containing solvent, does not become a shape where it sags at the periphery of the partition wall and rises at the center of the pixel or a shape where it sags at the periphery of the partition wall and rises at the inner side, and a concave portion is formed in the pixel center portion (first comparison example of FIG. 11), and its surface becomes flat (see the second embodiment of FIG. 11). The 'coating of the liquid composition' means forming the liquid composition on the substrate by means of all methods, and includes a case in which the liquid composition is coated by means of a spin coating method, and a case in which the liquid composition is coated (ejected) by means of an inkjet method.

Preferably, the fluorine group-containing solvent is contained in the solvent within a range of 10 to 50 percent by volume. When the volume content of the fluorine group-containing solvent is less than 10 percent by volume, the lyophobic property with respect to the partition wall excessively increases, so that the flatness of the functional layer to be formed becomes low. In contrast, when the volume content exceeds 50 percent by volume, the lyophilic property with respect to the partition wall excessively increases, so that the functional layer to be formed sags along the partition wall. In the center of the pixel, the concave portion can be easily formed. As a result, the flatness may be low.

According to a second aspect of the invention, there is provided a method of manufacturing an organic EL device. The method includes forming partition walls partitioning pixels on a substrate; subjecting a surface of each of the partition walls to a lyophobic treatment; coating a liquid composition on each of regions surrounded by the partition walls, the liquid composition obtained by dissolving and dispersing a forming material of a functional layer forming at least a portion of an organic EL element in a solvent; and drying the coated liquid composition so as to form the functional layer, dissolving the functional layer with a solvent containing a fluorine group-containing solvent to dry the functional layer again.

According to this aspect, the organic EL device, which can form the functional layer with high flatness and has an excellent light-emitting characteristic without light-emitting irregularities, can be achieved. That is, the functional layer formed by drying the coated liquid composition is dissolved again using the solvent containing fluorine group-containing solvent, and is then dried again, so that the flatness of the functional layer can be improved. Specifically, the shape of the functional layer, which is reformed by the solvent containing the fluorine group-containing solvent, does not become a shape where it sags at the periphery of the partition wall and rises at the center of the pixel or a shape where it sags at the periphery of the partition wall and rises at the inner side, and a concave portion is formed in the pixel center portion, and its surface becomes flat. The 'coating of the liquid composition' means forming the liquid composition on the substrate by means of all methods, and includes a case in which the liquid composition is coated by means of a spin coating method, and a case in which the liquid composition is coated (ejected) by means of an inkjet method.

Preferably, during the subjecting the surface of each of the partition walls to the lyophobic treatment, the surface of each of the partition walls is subjected to a fluorination treatment. As such, the surface of the partition wall can be subjected to the lyophobic treatment by means of the fluorination treatment, and an affinity for the solvent containing the fluorine group-containing solvent can be improved. In addition, the flatness of the functional layer can be further improved.

According to a third aspect of the invention, there is provided a method of manufacturing a device. The method includes forming partition walls partitioning predetermined regions on a substrate; subjecting a surface of each of the partition walls to a lyophobic treatment; coating a liquid composition on each of regions surrounded by the partition walls, the liquid composition obtained by dissolving and dispersing a forming material of a functional layer forming at least a portion of the device in a solvent; and drying the coated liquid composition so as to form the functional layer. The solvent contains a fluorine group-containing solvent.

According to this aspect, the device, which can form the functional layer with high flatness and prevent irregularities of a predetermined device characteristic in the predetermined region, can be achieved. That is, since the liquid composition is formed by the solvent containing the fluorine group-containing solvent such that the liquid composition does not have an extreme lyophobic property with respect to the partition walls having been subjected to the lyophobic treatment, the functional layer formed by coating and drying the liquid composition has high flatness. Specifically, the functional layer, which is formed of the liquid composition containing the fluorine group-containing solvent, does not become a shape where it sags at the periphery of the partition wall and rises at the center of the pixel or a shape where it sags at the periphery of the partition wall and rises at the inner side, and a concave portion is formed in the pixel center portion, and its surface becomes flat. The 'coating of the liquid composition' means forming the liquid composition on the substrate by means of all methods, and includes a case in which the liquid composition is coated by means of a spin coating method, and a case in which the liquid composition is coated (ejected) by means of an inkjet method.

According to a fourth aspect of the invention, there is provided a method of manufacturing a device. The method includes forming partition walls partitioning predetermined regions on a substrate; subjecting a surface of each of the partition walls to a lyophobic treatment; coating a liquid composition on each of regions surrounded by the partition walls, the liquid composition obtained by dissolving and dispersing a forming material of a functional layer forming at least a portion of the device in a solvent; and drying the coated liquid composition so as to form the functional layer, dissolving the functional layer with a solvent containing a fluorine group-containing solvent to dry the functional layer again.

According to this aspect, the device, which can form the functional layer with high flatness and prevent irregularities of a predetermined device characteristic in the predetermined region, can be achieved. That is, the flatness of the functional layer formed by drying the coated liquid composition can be improved by dissolving the functional layer again using the solvent containing the fluorine group-containing solvent and drying it again. Specifically, the functional layer, which is reformed by the solvent containing the fluorine group-containing solvent, does not become a shape where it sags at the periphery of the partition wall and rises at the center of the pixel or a shape where it sags at the periphery of the partition wall and rises at the inner side, and a concave portion is formed in the pixel center portion, and its surface becomes flat. The 'coating of the liquid composition' means forming the liquid composition on the substrate by means of all methods, and includes a case in which the liquid composition is coated by means of a spin coating method, and a case in which the liquid composition is coated (ejected) by means of an inkjet method.

BRIEF DESCRIPTION OF THE DRAWINGS

The invention will be described with reference to the accompanying drawings, wherein like numbers reference like elements.

FIG. 12 is a diagram illustrating a maximum height y and a minimum height x of a film shown in FIG. 11.

FIG. 13 is a diagram illustrating a shape of a light-emitting layer of each of the organic EL devices according to fifth and sixth embodiments and a first comparison example.

FIG. 14 is a diagram illustrating a shape of a light-emitting layer of each of the organic EL devices according to a seventh embodiment and a first comparison example.

FIG. 15 is a diagram schematically illustrating a cross section of a color filter manufactured by a manufacturing method of an embodiment of the invention.

FIG. 16 is a perspective view illustrating an example of an electronic apparatus.

DESCRIPTION OF EXEMPLARY EMBODIMENTS

Hereinafter, preferred embodiments of the invention will be described in detail with reference to the accompanying drawings. In the respective embodiments, a structure of an organic EL device, which is manufactured by a manufacturing method according to an embodiment of the invention, will be described, and then the manufacturing method will be described in detail. In addition, in the respective embodiments, in each drawing, the scale of each layer or member is adjusted in order to have a recognizable size.

Organic EL Device

Figure 1:
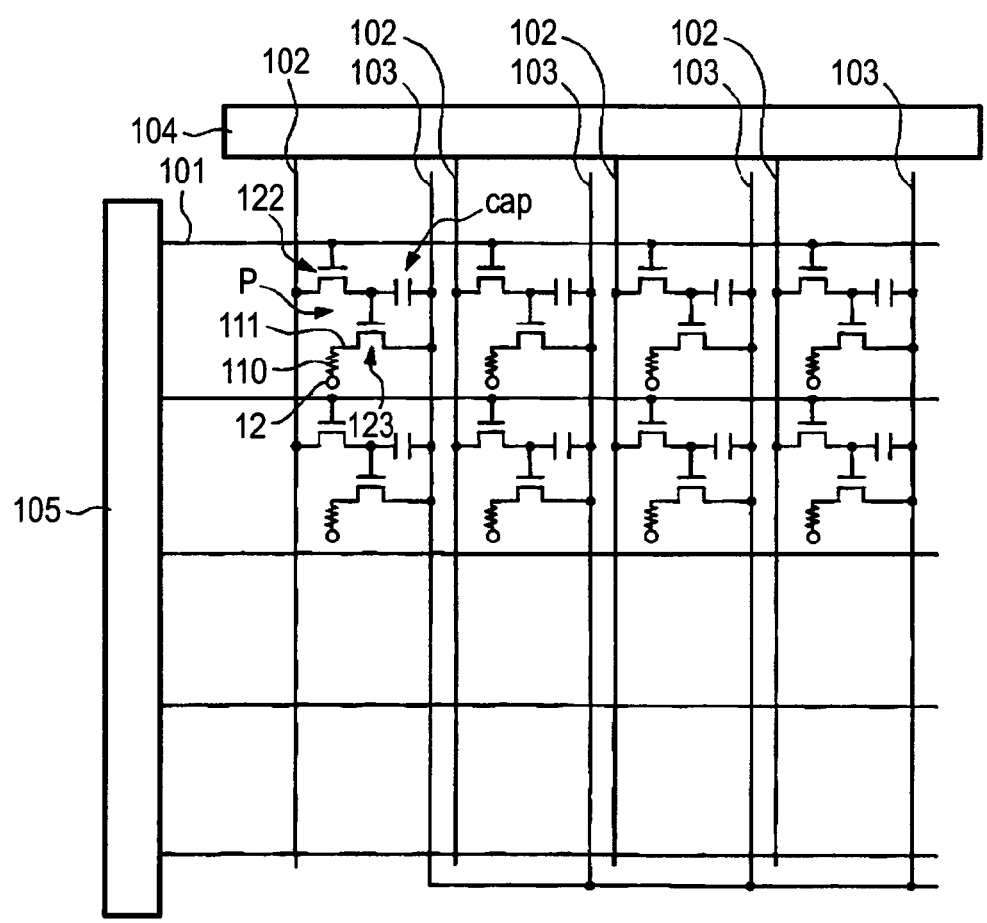
FIG. 1 is a circuit diagram of an organic EL device manufactured by a manufacturing method according to an embodiment of the invention.
Figure 2:
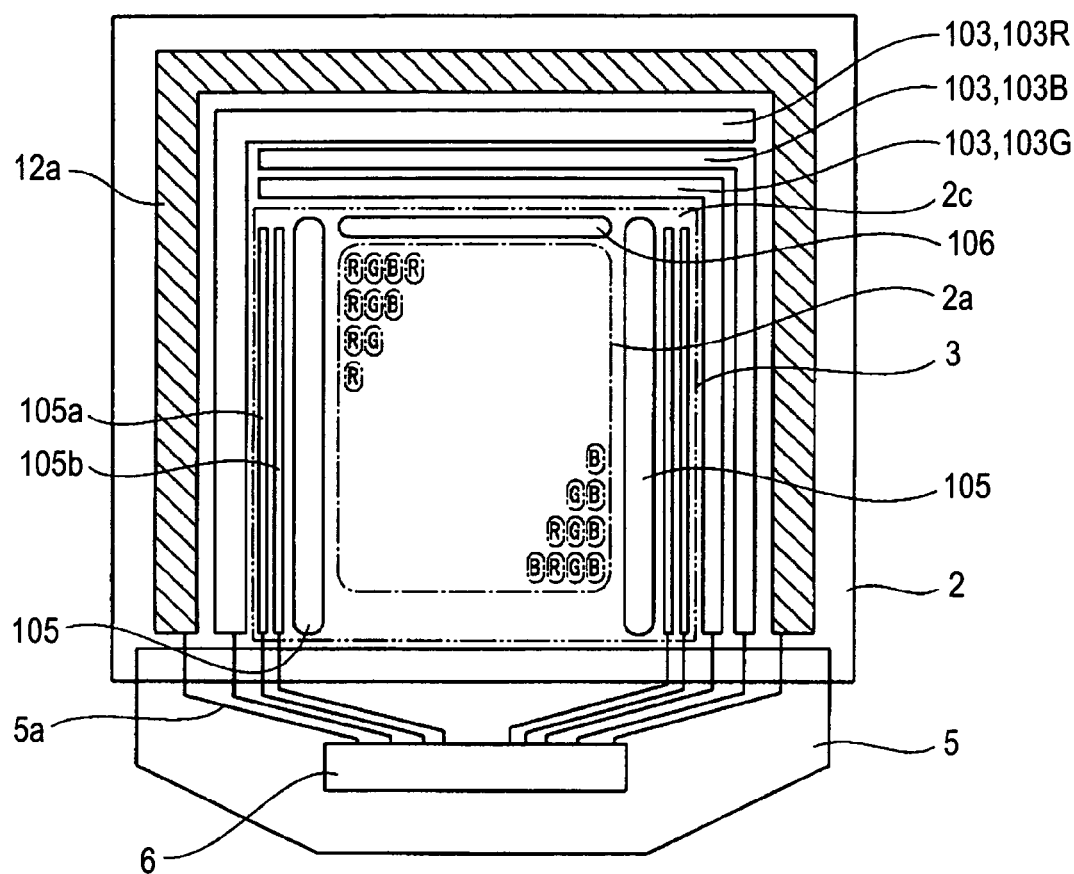
FIG. 2 is a diagram illustrating a planer structure of the organic EL device.
Figure 3:
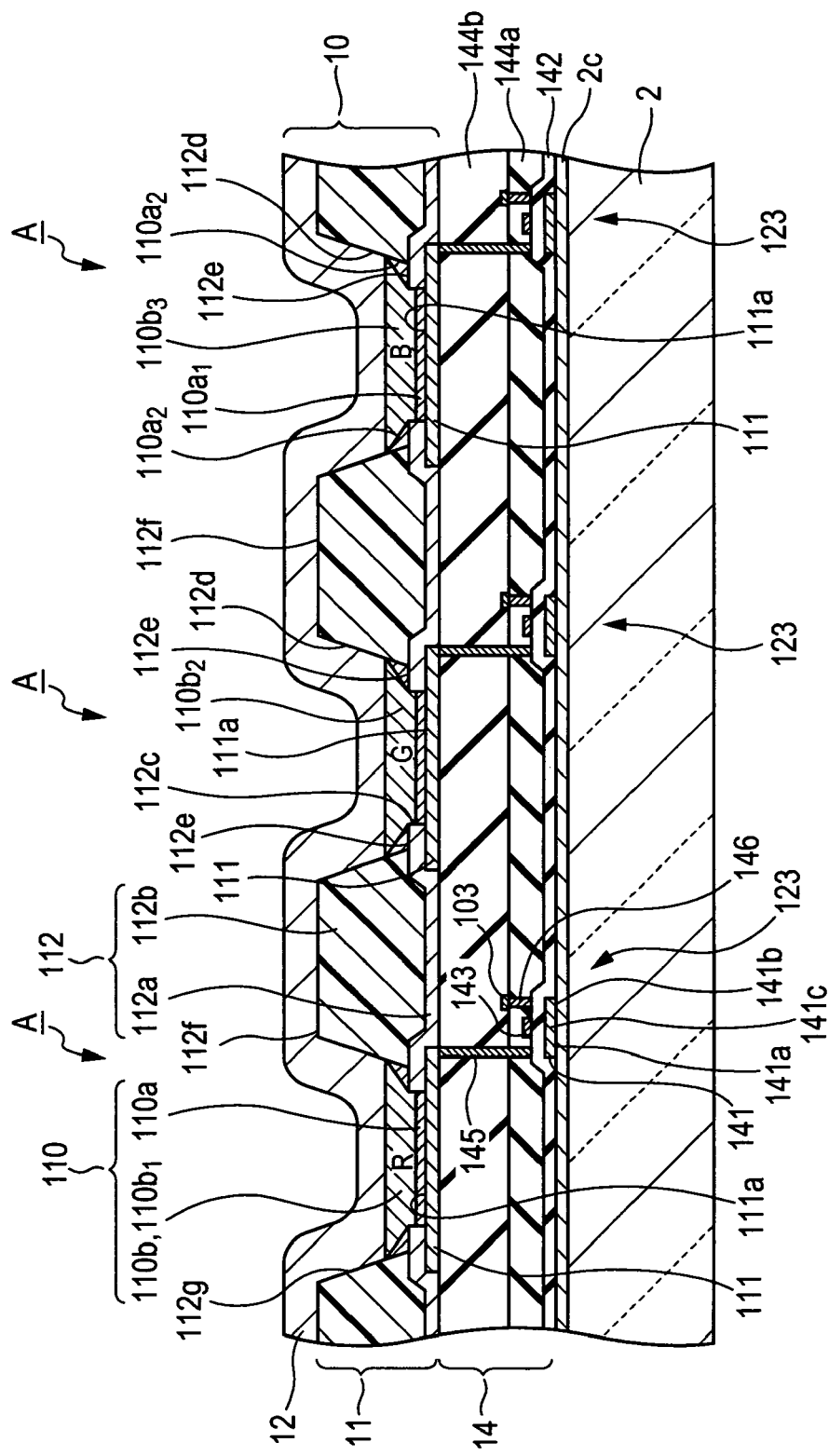
FIG. 3 is a diagram illustrating a sectional structure of a display region of the organic EL device.

FIG. 1 is a diagram illustrating a wiring structure of an organic EL device manufactured by a manufacturing method according to an embodiment of the invention. FIG. 2 is a diagram schematically illustrating a planar structure of the organic EL device. FIG. 3 is a diagram schematically illustrating a sectional structure of a display region of the organic EL device.

As shown in FIG. 1, the organic EL device according to the present embodiment includes a plurality of scanning lines 101, a plurality of signal lines 102 each of which extends in a direction crossing each of the plurality of scanning lines 101, and a plurality of power supply lines 103 each of which extends in a direction parallel to each of the plurality of signal lines 102. In addition, each of pixel regions p is provided at an intersection of each of the scanning lines 101 and each of the signal lines 102.

A data line driving circuit 104, which includes a shift register, a level shifter, a video line, and an analog switch, is connected to each of the signal lines 102. In addition, a scanning line driving circuit 105, which includes a shift register and a level shifter, is connected to each of the scanning lines 101.

In addition, each of the pixel regions P includes a switching thin-film transistor 122 in which a scanning signal is supplied to a gate electrode through the scanning line 101, a storage capacitor cap that holds a pixel signal supplied from the signal line 102 through the switching thin-film transistor 122, a driving thin-film transistor 123 in which the pixel signal held by the storage capacitor cap is supplied to a gate electrode, a pixel electrode 111 (anode) in which a driving current flows from the power supply line 103 when the pixel electrode 111 is electrically connected to the corresponding power supply line 103 through the driving thin-film transistor 123, and an organic EL layer 110 that is interposed between the pixel electrode 111 and a counter electrode 12 (cathode). The pixel electrode 111, the counter electrode 12, and the organic EL layer 110 form a light-emitting element.

If the scanning line 101 is driven and the switching thin-film transistor 122 is turned on, a potential of the signal line 102 is held in the storage capacitor cap, and on and off states of the driving thin-film transistor 123 are determined according to a state of the storage capacitor cap. In addition, a current flows from the power supply line 103 to the pixel electrode 111 through a channel of the driving thin-film transistor 123, and then flows into the cathode 12 through the organic EL layer 110. From the organic EL layer 110, light is emitted according to an amount of current flowing therethrough.

As shown in FIG. 3, the organic EL device according to the present embodiment includes a transparent substrate 2 that is made of glass or the like, a light-emitting element unit 11 that has a light-emitting element disposed in a matrix and is formed on the substrate 2; and a cathode 12 that is formed on the light-emitting element unit 11. In this case, the light-emitting element unit 11 and the cathode 12 form a display element 10.

The substrate 2 is a transparent substrate that is made of glass or the like. As shown in FIG. 2, the substrate 2 has a display region 2a that is located at the center of the substrate 2 and a non-display region 2c that is formed at a periphery of the substrate 2 and surrounds the display region 2a. Further, the display region 2a is a region in which the plurality of light-emitting elements is disposed in a matrix.

In addition, in the non-display region 2c, the power supply lines 103 (103R, 103G, and 103B) are provided. The scanning line driving circuits 105 and 105 are disposed at both sides of the display region 2a. Further, a control signal wiring line for a driving circuit 105a and a power supply wiring line for a driving circuit 105b, which are connected to each of the scanning line driving circuits 105 and 105, are provided at one side of each of the scanning line driving circuits 105 and 105. A test circuit 106, which tests a quality and a defect of the display device during a manufacturing process or at the time of shipment, is disposed at an upper side of the display region 2a in the drawing.

In FIG. 3 where a sectional structure of a display region of the organic EL device is illustrated, three pixel regions A are illustrated. In the organic EL device according to the present embodiment, a circuit element unit 14 having a circuit such as a TFT or the like provided therein, a light-emitting element unit 11 having the organic EL layer 110 provided therein, and a cathode 12 are sequentially laminated on the substrate 2. The light emitted from an organic EL layer 110 toward the substrate 2 passes through the circuit element unit 14 and the substrate 2 and is emitted from the lower side of the substrate 2 (observer side). In addition, the light emitted from the organic EL layer 110 toward a side opposite to the substrate 2 is reflected on the cathode 12, passes through the circuit element unit 14 and the substrate 2, and is emitted from the lower side of the substrate 2 (observer side). If a transparent material is used as a forming material of the cathode 12, the light emitted from the cathode side can be emitted. Examples of the transparent cathode materials may include ITO (indium tin oxide), Pt, Ir, Ni, or Pd.

In the circuit element unit 14, a base protective film 2c, which is composed of a silicon oxide film, is formed on the substrate 2, and a semiconductor film 141, which is made of polycrystalline silicon and has an island shape, is formed on the base protective film 2c. In the semiconductor film 141, a source region 141a and a drain region 141b are formed by means of a high concentration phosphorous ion implanting method. A portion of the semiconductor film where the phosphorous ion is introduced becomes a channel region 141c.

In addition, a transparent gate insulating film 142 is formed in order to cover the base protective film 2c and the semiconductor film 141, a gate electrode 143 (scanning line 101), which is made of Al, Mo, Ta, Ti, W or the like, is formed on the gate insulating film 142, and a first transparent interlayer insulating film 144a and a second transparent interlayer insulating film 144b are formed on the gate electrode 143 and the gate insulating film 142. The gate electrode 143 is provided at a location corresponding to the channel region 141c of the semiconductor film 141. In addition, contact holes 145 and 146, which are respectively connected to the source and drain regions 141a and 141b of the semiconductor film 141, are formed by penetrating the first and second interlayer insulating films 144a and 144b.

In addition, on the second interlayer insulating film 144b, a transparent pixel electrode 111 made of ITO is formed so as to be patterned in a predetermined shape. One contact hole 145 is connected to the pixel electrode 111. In addition, the other contact hole 146 is connected to the power supply line 103. In this way, in the circuit element unit 14, the driving thin-film transistor 123 connected to each pixel electrode 111 is formed.

The light-emitting element unit 11 mainly has organic EL layers 110 each of which is formed on each of the plurality of pixel electrodes 111 . . . , and bank portions 112 each of which is provided between each pixel electrode 111 and each organic EL layer 110 and defines each organic EL layer 110. The cathode 12 is disposed on the organic EL layer 110. The pixel electrode 111, the organic EL layer 110, and the cathode 12 constitute a light-emitting element. In this case, each of the pixel electrodes 111 is formed of, for example, ITO, and is formed so as to have a rectangular shape in plan view. The bank portions 112 are formed so as to partition the pixel electrodes 111.

As shown in FIG. 3, each of the bank portions 112 has a structure in which an inorganic bank layer 112a (first bank layer) and an organic bank layer 112b (second bank layer) are laminated. The inorganic bank layer 112a serves as a first partition wall located at the substrate 2 side and the organic bank layer 112b serves as a second partition wall located at a location so as to be spaced apart from the substrate 2. The inorganic bank layer 112a is formed of, for example, $TiO_2$ or SiO$_2$, and the organic bank layer 112b is formed of, for example, an acrylic resin, a polyimide resin or the like.

The inorganic bank layer 112a and the organic bank layer 112b are formed so as to ride on a peripheral portion of the pixel electrode 111. The pixel electrode 111 and the inorganic bank layer 112a are disposed such that the pixel electrode 111 partially overlaps the inorganic bank layer 112a in plan view. In the same manner, the organic bank layer 112b is disposed so as to partially overlap the pixel electrode 111 in plan view. In addition, the inorganic bank layer 112a protrudes more toward the center of the pixel electrode 111 than the end portion of the organic bank layer 112b. In this way, a first laminated portion 112e (protruding portion) of the inorganic bank layer 112a is formed at the inner side of the pixel electrode 111, so that a lower opening 112c corresponding to a forming location of the pixel electrode 111 is provided.

In addition, in the organic bank layer 112b, an upper opening 112d is formed. The upper opening 112d is provided so as to correspond to the forming location of the pixel electrode 111 and the lower opening 112c. As shown in FIG. 3, the upper opening 112d is formed such that it has a larger frontage than the lower opening 112c and has a smaller area than the pixel electrode 111. In addition, there is a case in which an upper portion of the upper opening 112d and the end of the pixel electrode 111 are formed at almost the same location. In this case, as shown in FIG. 3, a cross section of the upper opening 112d of the organic bank layer 112b is inclined. In this way, in the bank portion 112, an opening 112g though which the lower opening 112c and the upper opening 112d communicate with each other is formed.

In addition, in the bank portion 112, a region having a lyophilic property and a region having a lyophobic property are formed. The regions having the lyophilic property correspond to the first laminated portion 112e of the inorganic bank layer 112a and an electrode surface 111a of the pixel electrode 111. The surfaces of these regions having the lyophilic property are subjected to a lyophilic treatment by means of a plasma treatment using oxygen as a treatment gas. In addition, the regions having the lyophobic property correspond to a wall surface of the upper opening 112d and the top surface 112f of the organic bank layer 112. The surfaces of these regions having the lyophobic property are subjected to a fluorination treatment (lyophobic treatment) by means of a plasma treatment using tetrafluoromethane as a treatment gas.

The organic EL layer 110 includes a hole injecting/carrying layer 110a laminated on the pixel electrode 111 and a light-emitting layer 110b formed on the hole injecting/carrying layer 110a.

The hole injecting/carrying layer 110a has a function for injecting the hole into the light-emitting layer 110b and a function for carrying the hole in the hole injecting/carrying layer 110a. The hole injecting/carrying layer 110a is provided between the pixel electrode 111 and the light-emitting layer 110b, so that a light-emitting efficiency of the light-emitting layer 110b and an element characteristic such as a life span of the element are improved. In the light-emitting layer 110b, the hole injected from the hole injecting/carrying layer 110a is recombined with the electron injected from the cathode 12 and the light is emitted.

The hole injecting/carrying layer 110a has a flat portion 110a1 that is located in the lower opening 112c and is formed on the pixel electrode surface 111a and a peripheral portion 110a2 that is located in the upper opening 112d and is formed on the first laminated portion 112e of the inorganic bank layer. In addition, the hole injecting/carrying layer 110a has a structure in which it is formed on only a portion of the pixel electrode 111 so as to be formed between the inorganic bank layer 112a (in the lower opening 112c) (it may be formed on only the flat portion).

In addition, the light-emitting layer 110b is formed to extend on the flat portion 110a1 of the hole injecting/carrying layer 110a and the peripheral portion 110a2. The thickness of the light-emitting layer 110b on the flat portion 111 is within a range of 50 to 80 nm. The light-emitting layer 110b has three kinds of light-emitting layers that includes a red light-emitting layer 110b1 to emit red (R) light, a green light-emitting layer 110b2 to emit green (G) light, and a blue light-emitting layer 110b3 to emit blue (B) light. As shown in FIG. 2, the respective light-emitting layers 110b1 to 110b3 are disposed in a stripe.

Since the peripheral portion 110a2 having a uniform thickness is formed on the first laminated portion 112e of the inorganic bank layer, the peripheral portion 110a2 is insulated from the pixel electrode 111 by means of the first laminated portion 112e, and the hole is not injected into the light-emitting layer 110b from the peripheral portion 110a2. Thereby, the current flowing from the pixel electrode 111 flows into only the flat portion 112a1, so that the holes can be uniformly transported from the flat portion 112a1 to the light-emitting layer 110b. In addition, light can be emitted from only the center of the light-emitting layer 110b, and an amount of light emitted from the light-emitting layer 110b can be maintained at a predetermined amount.

In addition, since the inorganic bank layer 112a extends more toward the center of the pixel electrode 111 than the organic bank layer 112b, it is possible to trim a shape of a bonding portion between the pixel electrode 111 and the flat portion 110a1 by means of the inorganic bank layer 112a, so that it is possible to prevent the light-emitting intensity from being different from each other between the light-emitting layers 110b.

Further, since each of the electrode surface 111a of the pixel electrode 111 and the first laminated portion 112e of the inorganic bank layer has a lyophilic property, the organic EL layer 110 uniformly adheres closely to the pixel electrode 111 and the inorganic bank layer 112a, so that it is possible to prevent the pixel electrode 111 and the cathode 12 from being short-circuited without excessively decreasing the thickness of the organic EL layer 110 formed on the inorganic bank layer 112a.

Furthermore, since each of the top surface 112f of the organic bank layer 112b and the wall surfaces of the upper opening 112d have a lyophobic property, the organic EL layer 110 does not adhere closely to the organic bank layer 112b, so that the organic EL layer 110 is formed so as to be separated from the opening 112g.

In addition, examples of the forming materials of the hole injecting/carrying layer may include polythiophene derivatives such as polyethylenedioxythiophene or the like or mixtures such as polystyrenesulfonate or the like. In addition, examples of the forming materials of the light-emitting layer 110b may include, for example, a (poly)paraphenylenevinylene derivative, a polyphenylene derivative, a polyfluorene derivative, a polyvinylcarbazole derivative, a polythiophene derivative, a perylene-based derivative, a coumarin-based derivative, a rhodamine-based derivative, or materials obtained by doping these polymeric materials with a polymeric material such as rubrene, perylene, 9,10-diphenylanthracene, tetraphenylbutadiene, nile red, coumarin-6, quinacridone or the like.

The cathode 12 is formed on the entire surface of the light-emitting element unit 11, and forms a pair together with the pixel electrode 111 to make a current flow into the organic EL layer 110. The cathode 12 has a structure in which a calcium layer and an aluminum layer are laminated. At this time, it is preferable that the cathode close to the light-emitting layer have a small work function. In this case, the cathode directly comes into contact with the light-emitting layer 110b to inject the electron into the light-emitting layer 110b.

In addition, there is a case in which LiF is formed between the light-emitting layer 110b and the cathode 12 in order to improve the light-emitting efficiency. In addition, a forming material of each of the red and green light-emitting layers 110b1 and 110b2 is limited to the lithium fluoride, and other materials may be used. Accordingly, in this case, on only the blue (B) light-emitting layer 110b3, a layer formed of lithium fluoride is laminated, and layers formed of materials other than the lithium fluoride may be laminated on the red and green light-emitting layers 110b1 and 110b2. That is, layers formed of lithium fluoride are not laminated on the red and green light-emitting layers 110b1 and 110b2, and layers formed of calcium may be laminated thereon.

In addition, since the aluminum for forming the cathode 12 reflects the light emitted from the light-emitting layer 110b toward the substrate 2, the cathode 12 is preferably formed of a film made of Ag, a laminated film made of Al and Ag or the like, in addition to the film of Al. In addition, an oxidation preventing protective layer made of SiO, $SiO_2$, SiN or the like may be provided on the aluminum layer.

In the actual organic EL device, a sealing portion is provided on the light-emitting element unit 11 shown in FIG. 3. This sealing portion can be formed by applying a sealing resin onto the vicinity of the substrate 2 in a ring shape and sealing it with a sealing can. The sealing resin is made of a thermosetting resin or an ultraviolet curable resin. In particular, it is preferable that it be made of an epoxy resin which is one kind of the thermosetting resin. This sealing portion is provided so as to prevent the light-emitting layer formed in the cathode 12 or the light-emitting unit portion 11 from oxidizing. In addition, a getter agent for absorbing water, oxygen or the like is provided in the sealing can, so that it can absorb the water or oxygen that has permeated into the sealing can.

Method of Manufacturing Organic EL Device

Next, a method of manufacturing the organic EL device will be described with reference to the accompanying drawings.

The method of manufacturing the organic EL device according to the present embodiment includes (1) a bank portion forming process, (2) a bank portion surface treatment process (lyophobic treatment process), (3) a hole injecting/carrying layer forming process, (4) a light-emitting layer forming process, (5) a cathode forming process, and (6) a sealing process.

However, the above-mentioned method of manufacturing the organic EL device is only an example. Accordingly, other processes can be added to the method or some of the processes of the method can be removed, if necessary. In addition, (3) the hole injecting/carrying process and (4) the light-emitting layer forming process are performed by means of a droplet ejecting method (inkjet method) using the droplet ejecting device.

Bank Portion Forming Process

Figure 4:
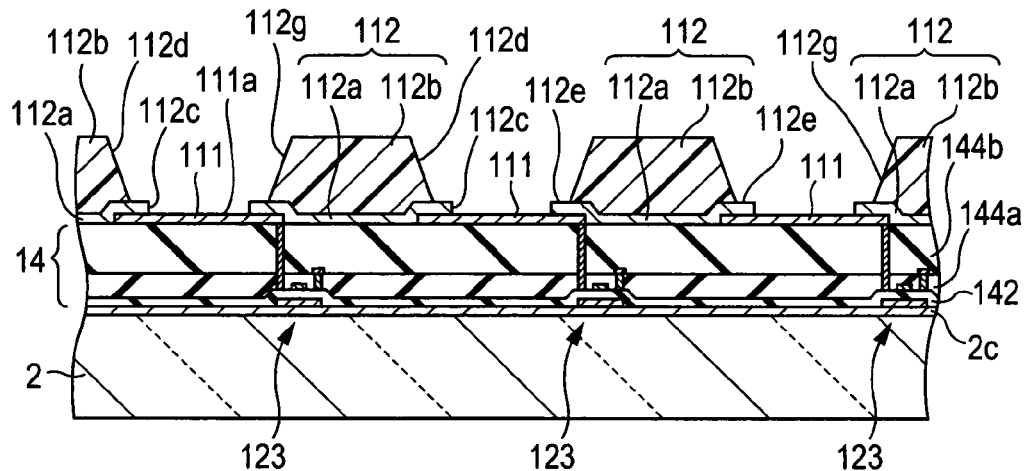
FIG. 4 is a diagram illustrating a process of a manufacturing method according to the embodiment.

In the bank portion forming process, the bank portion 112 shown in FIG. 4 is formed at a predetermined location of the substrate 2. The bank portion 112 has a structure in which it has an inorganic bank layer 112a serving as the first bank layer and an organic bank layer 112b serving as the second bank layer.

Forming Inorganic Bank Layer 112a

As shown in FIG. 4, first, the inorganic bank layer 112a is formed at a predetermined location above the substrate. The location where the inorganic bank layer 112a is formed is on a second interlayer insulating film 144b and a pixel electrode 111. In addition, the second interlayer insulating film 144b is formed on the circuit element unit 14 on which the thin-film transistor, the scanning line, the signal line or the like are disposed. The inorganic bank layer 112a is made of an inorganic material, such as, for example, $SiO_2$, $TiO_2$ or the like. These materials are formed by means of, for example, a CVD method, a coating method, a sputtering method, a deposition method or the like. In addition, preferably, the thickness of the inorganic bank layer 112a is within a range of 50 to 200 nm, and more preferably, it is 150 nm.

The inorganic bank layer 112a is formed so as to have an opening by forming the inorganic film on the entire surfaces of the interlayer insulating layer 144 and the pixel electrode 111 and patterning the inorganic film using a lithography method. The opening is provided at a location corresponding to the location where the electrode surface 111a of the pixel electrode 111 is formed. In addition, the opening is provided so as to serve as the lower opening 112c, as shown in FIG. 4. At this time, the inorganic bank layer 112a is provided so as to partially overlap the peripheral portion of the pixel electrode 111, so that a planar light-emitting area of the light-emitting layer 110 is controlled.

Forming Organic Bank Layer 112b

Next, the organic bank layer 112b serving as the second bank layer is formed.

Specifically, as shown in FIG. 4, the organic bank layer 112b is formed on the inorganic bank layer 112a. As forming materials of the organic bank layer 112b, materials, such as an acrylic resin, a polyimide resin or the like, having heat resistance and solvent resistance, are used. The organic bank layer 112b is formed by patterning these materials by mean of a photolithography technology. When the patterning is performed, the upper opening 112d is formed on the organic bank layer 112b. The upper opening 112d is provided at a location corresponding to the locations where the electrode surface 111a and the lower opening 112c are formed.

As shown in FIG. 4, preferably, the upper opening 112d is formed so as to have a larger area than the lower opening 112c formed in the inorganic bank layer 112a. Further, preferably, the organic EL layer 112b has a tapered cross section shape. In addition, preferably, on the bottom surface of the organic bank layer 112b, the width of the bottom surface of the organic bank layer 112b is smaller than that of the pixel electrode 111, and the width of the top surface of the organic bank layer 112b is almost equal to that of the pixel electrode 111.

Thereby, the first laminated portion 112e, which surrounds the lower opening 112c of the inorganic bank layer 112a, protrudes more toward the center of the pixel electrode 111 than the organic bank layer 112b. In this way, the upper opening 112d formed in the organic bank layer 112b communicates with the lower opening 112c formed in the inorganic bank layer 112a, so that an opening 112g penetrating the inorganic bank layer 112a and the organic bank layer 112b is formed. In the present embodiment, a protruding amount of a portion of the inorganic bank layer 112a, which protrudes toward the center of the pixel electrode 111, has a different value for each pixel. Specifically, a protruding amount of a portion of the inorganic bank layer 112a, which protrudes toward the center of the pixel electrode 111, has a different value for each of light-emitting layers 110b1, 110b2, and 110b3.

In addition, preferably, the thickness of the organic bank layer 112b is within a range of 0.1 to 3.5 μm, and more preferably, it is about 2 μm. The reason why the thickness of the organic bank layer 112b is within a range of 0.1 to 3.5 μm results from the following reason.

That is, if the thickness of the organic bank layer 112b is less than 0.1 μm, the thickness of the organic bank layer 112b becomes smaller than a total thickness of the hole injecting/carrying layer and the light-emitting layer, so that the light-emitting layer 110b may protrude from the upper opening 112d. Accordingly, it is not preferable. In addition, if the thickness of the organic bank layer 112b exceeds 3.5 μm, the step due to the upper opening 112d increases, so that the step coverage of the cathode 12 in the upper opening 112d cannot be obtained. Accordingly, it is not preferable. In addition, if the thickness of the organic bank layer 112b is about 2 μm or more, since it is possible to improve the insulation between the cathode 12 and the driving thin-film transistor 123, it is preferable.

Bank Portion Surface Treatment Process

Further, the surfaces of the bank portion 112 and the pixel electrode 111 are subjected to the proper surface treatment by means of a plasma treatment. Specifically, the surface of the bank portion 112 is subjected to the lyophobic treatment, and the surface of the pixel electrode 111 is subjected to the lyophilic treatment.

First, the surface treatment of the pixel electrode 111 is performed by means of an $O_2$ plasma treatment using oxygen gas, for example, under the conditions of a plasma power of 100 to 800 KW, an oxygen gas mass flow of 50 to 100 ml/min, a substrate transporting speed of 0.5 to 10 mm/sec, and a substrate temperature of 70 to 90 C.°, so that a region including the surface of the pixel electrode 111 is subjected to a lyophilic treatment. At the same time, by means of the $O_2$ plasma treatment, the surface of the pixel electrode 111 can be cleaned and the work function can be adjusted.

Next, the surface treatment of the bank portion 112 can be performed by means of a $CF_4$ plasma treatment using tetrafluoromethane. For example, the surface treatment of the bank portion 112 can be performed by means of the $CF_4$ plasma treatment under the conditions of a plasma power of 100 to 800 KW, a tetrafluoromethane gas mass flow of 50 to 100 ml/min, a substrate transporting speed of 0.5 to 10 mm/sec, and a substrate temperature of 70 to 90 C.°, so that the upper opening 112d and the top surface 112f of the bank portion 112 can be subjected to a lyophobic treatment.

Hole Injecting/carrying Layer Forming Process

Next, in order to form a light-emitting element, first, a hole injecting/carrying layer is formed on the pixel electrode 111. In the hole injecting/carrying layer according to the present embodiment, an inkjet method is used, but a spin coating method, a coating method using a liquid phase or the like can be used.

As described above, in the hole injecting/carrying layer forming process, a liquid composition containing a forming material of the hole injecting/carrying layer is ejected onto the electrode surface 111a by means of an inkjet method, that is, an inkjet device serving as a droplet ejecting device. After that, a drying treatment and a heat treatment are performed, and the hole injecting/carrying layer 110a is formed on the pixel electrode 111 and the inorganic bank layer 112a. In this case, the hole injecting/carrying layer 110a is not formed on the first laminated portion 112e, that is, it is formed on only the pixel electrode 111.

The method of manufacturing the hole injecting/carrying layer using the inkjet method is as follows.

Figure 5:
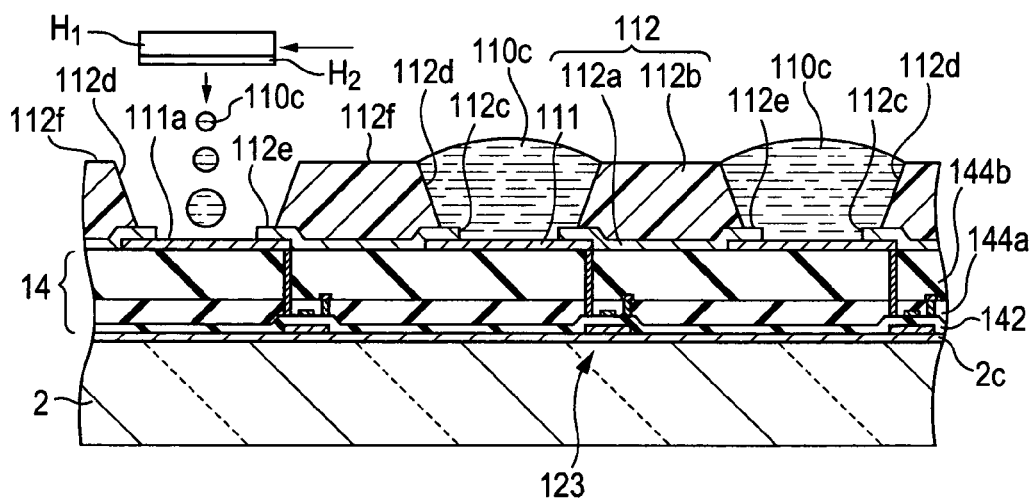
FIG. 5 is a diagram illustrating a process of a manufacturing method according to the embodiment.

That is, as shown in FIG. 5, a liquid composition including a forming material of a hole injecting/carrying layer is ejected from a plurality of nozzles formed in an inkjet head H1. In this case, the composition is filled in each of the pixels by scanning the inkjet head, but the composition can be filled by scanning the substrate 2. In addition, the composition can be filled by relatively moving an inkjet head and the substrate 2. In addition, this is true for the following processes using the inkjet head.

The ejection using the inkjet head is as follows. That is, ejection nozzles H2 formed in the inkjet head H1 is disposed so as to be opposite to the electrode surface 111a, and the liquid composition is ejected from the ejection nozzles H2. The bank portion 112 for defining the lower opening 112c is formed around the pixel electrode 111. In addition, the inkjet head H1 is disposed to be opposite to the pixel electrode surface 111a located in the lower opening 112c, and the droplets 110c of the liquid composition in which a fluid volume for each droplet is controlled are ejected onto electrode surface 111a through the ejection nozzles H2 while relatively moving the inkjet head H1 and the substrate 2.

As the liquid composition used in the present process, for example, a composition obtained by dissolving a polythiophene derivative such as polyethylenedioxythiophene (PEDOT) or the like and a mixture of polystyrene sulfonate (PSS) or the like in a polar solvent can be used. Examples of the polar solvent may include isopropanol alcohol (IPA), n-butanol, γ-butyrolactone, N-methylpyrrolidone (NMP), 1,3-dimethyl-2-imidazolidinone (DMI) and a derivative thereof, carbitol acetate, glycol ethers such as butyl carbitol acetate or the like.

As a specific composition, it is as follows: a PEDOT/PSS composition (PEDOT/PSS=1:20): 12.52 percent by weight, IPA: 10 percent by weight, NMP: 27.48 percent by weight, and DMI: 50 percent by weight. Preferably, viscosity of the liquid composition is within a range of 1 to 20 mPa·s, and more particularly, it is within a range of 4 to 15 mPa·s.

As shown in FIG. 5, the liquid droplets 110c of the ejected composition disperses on the electrode surface 111a and the first laminated portion 112e having been subjected to the lyophilic treatment, and are filled in the lower and upper openings 112c and 112d. Even when the ejection location of the first composition droplet 110c deviates from a predetermined ejection location so as to be ejected onto the top surface 112f, the top surface 112f does not become wet by the first composition droplet 110c, and the first composition droplet 110c having been ejected moves into the lower and upper openings 112c and 112d.

The amount of composition ejected onto the electrode surface 111a is determined by a size of each of the lower and upper openings 112c and 112d, the thickness of the hole injecting/carrying layer to be formed, and a concentration of the forming material of the hole injecting/carrying layer contained in the liquid composition. In addition, the droplets 110c of the liquid composition may be ejected on the same electrode surface 111a once, or may be ejected on the same electrode surface 111a many times. In this case, the amount of liquid composition in each ejection may be the same, and the liquid composition may be changed for each ejection. In addition, the liquid composition may be ejected onto the same place of the electrode surface 111a, or may be ejected onto a different place of the electrode surface 111a for each ejection.

Figure 6:
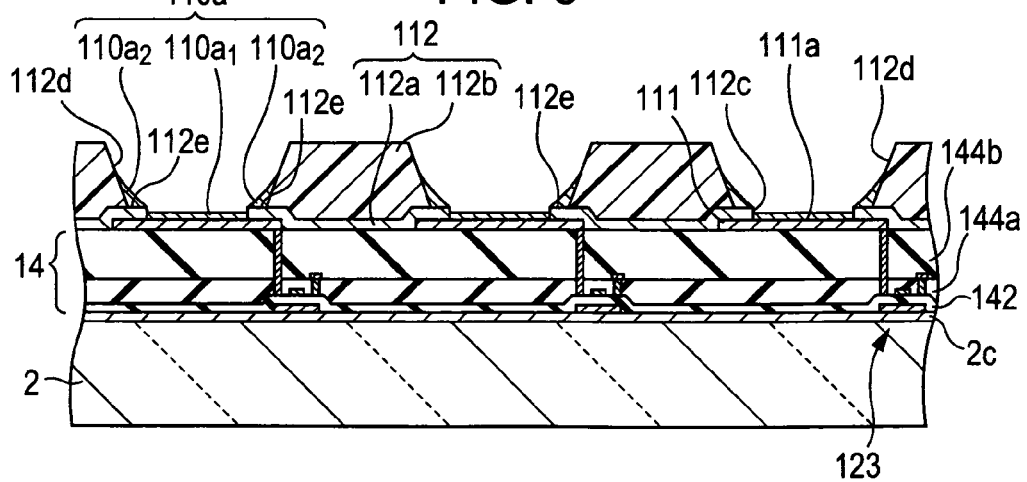
FIG. 6 is a diagram illustrating a process of a manufacturing method according to the embodiment.

Next, the drying process illustrated in FIG. 6 is performed. That is, the first composition having been ejected is subjected to the drying treatment, the solvent contained in the first composition is evaporated, and the hole injecting/carrying layer 110a is formed. If the drying treatment is performed, the evaporation of the solvent contained in the liquid composition is generated at a portion of the liquid composition close to the inorganic bank layer 112a and the organic bank layer 112b, and the solvent is then evaporated. In addition, the forming material of the hole injecting/carrying layer is concentrated and is then extracted. As a result, as shown in FIG. 6, a peripheral portion 110a2 made of the forming material of the hole injecting/carrying layer is formed on the first laminated portion 112e. The peripheral portion 110a2 adheres closely to the wall surface of the upper opening 112d (organic bank layer 112b), and a thickness of a portion of the peripheral portion 110a2 close to the electrode surface lila is small, and a thickness of a portion of the peripheral portion 110a2 spaced apart from the electrode surface 111a, that is, a thickness of a portion of the peripheral portion 110a2 close to the organic bank layer 112b is large.

In addition, at the same time, the evaporation of the solvent is also generated on the electrode surface 111a by the drying treatment, so that the flat portion 110a1 made of the forming material of the hole injecting/carrying layer is formed on the electrode surface 111a. Since the evaporating speed of the solvent is substantially constant on the electrode surface 111a, the forming material of the hole injecting/carrying layer is uniformly concentrated on the electrode surface 111a, so that the flat portion 110a1 having the uniform thickness is formed. In this way, the hole injecting/carrying layer 110a composed of the peripheral portion 110a2 and the flat portion 110a1 is formed. In addition, the hole injecting/carrying layer is formed on only the electrode surface 111a without being formed on the peripheral portion 110a2.

The drying treatment is performed with a pressure of about 133.3 Pa(1 Torr) at a room temperature in nitrogen atmosphere. Here, if the pressure is excessively low, since the droplets 110c of the composition may bump against each other, it is not preferable. In addition, if the temperature is more than the room temperature, the evaporation speed of the polar solvent increases, so that it is not possible to form the flat film. After the drying treatment, a heat treatment, which performs heating at a temperature of 200° C. in nitrogen atmosphere, preferably, in a vacuum, for ten minutes, is performed, so that the polar solvent or water remaining in the hole injecting/carrying layer 110a is preferably removed.

In the hole injecting/carrying layer forming process, the droplets 110c of the composition having been ejected are completely filled into the lower and upper openings 112c and 112d. In addition, the liquid composition is splashed on the organic bank layer 112b having been subjected to the lyophobic treatment, and the liquid composition moves into the lower and upper openings 112c and 112d. Thereby, the droplets 110c of the composition having been ejected can be filled into the lower and upper openings 112c and 112d, and the hole injecting/carrying layer 110a can be formed on the electrode surface 111a.

Light-emitting Layer Forming Process

The light-emitting layer forming process includes the light-emitting layer forming material ejecting process and the drying process.

Here, before the light-emitting layer forming material ejecting process, in the same manner as the above-mentioned bank portion surface treatment process, the surface of the flat portion 110a1 of the hole injecting/carrying layer 110a formed as shown in FIG. 6 is subjected to the lyophilic treatment by means of an oxygen plasma treatment. In contrast, the surface of each of the peripheral portion 110a2 and the bank portion 112 is subjected to the lyophobic treatment by means of a $CF_4$ plasma treatment. In addition, after the surface treatment process, in the same manner as the above-mentioned hole injecting/carrying layer forming process, the liquid composition for forming the light-emitting layer is ejected onto the hole injecting/carrying layer 110a using the inkjet method. After that, the liquid composition having been ejected is subjected to the drying treatment (and the heat treatment), and the light-emitting layer 110b is formed on the hole injecting/carrying layer 110a.

Figure 7:
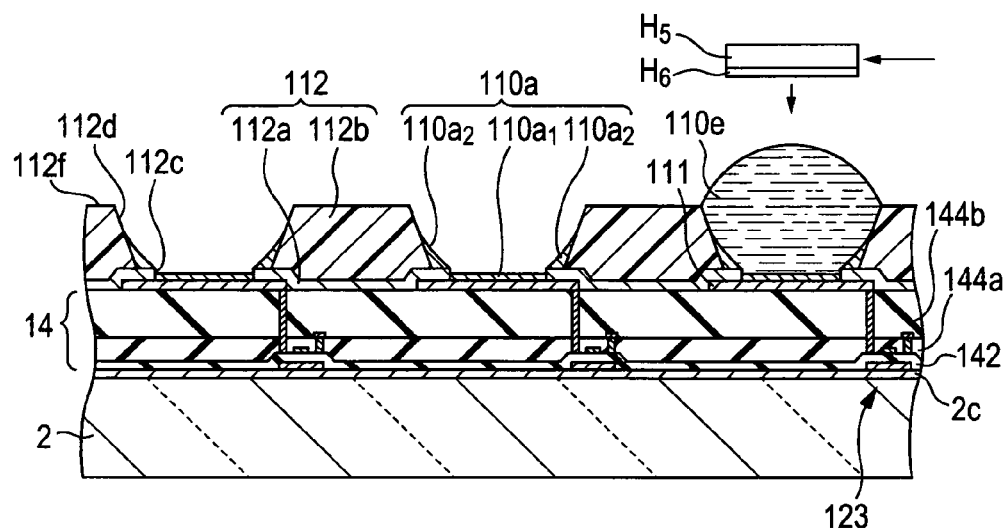
FIG. 7 is a diagram illustrating a process of a manufacturing method according to the embodiment.

FIG. 7 illustrates the ejection process of the liquid composition containing the light-emitting layer forming material by means of the inkjet method. As shown in FIG. 7, the inkjet head H5 and the substrate 2 relatively move, and the liquid composition containing the light-emitting layer forming material of each color (in this case, blue (B)) is ejected from the ejection nozzles H6 formed in the inkjet head.

When the liquid composition is ejected, the ejection nozzles are disposed to be opposite to the hole injecting/carrying layer 110a located in the lower and upper openings 112c and 112d, and the liquid composition is ejected while relatively moving the inkjet head H5 and the substrate 2. A fluid volume of each droplet ejected from the ejection nozzle H6 is controlled for each droplet. A liquid whose fluid volume is controlled (liquid composition droplet 110e) is ejected from the ejection nozzle, and the liquid composition droplet 110e is ejected onto the hole injecting/carrying layer 110a.

Figure 8:
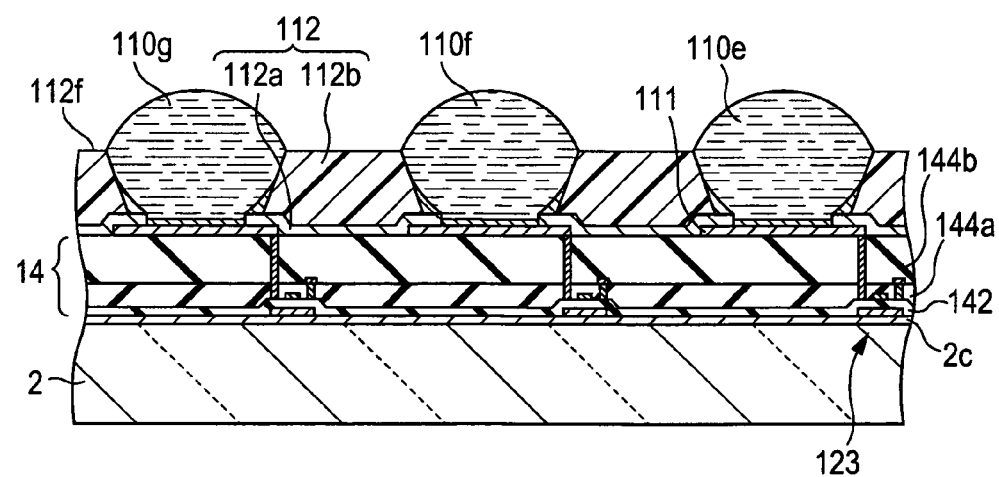
FIG. 8 is a diagram illustrating a process of a manufacturing method according to the embodiment.

In the present embodiment, after disposing the liquid composition droplet 110e, the liquid composition for forming another light-emitting layer is ejected. That is, as shown in FIG. 8, the liquid composition droplets 110f and 110g are ejected without drying the liquid composition droplet 110e dropped on the substrate 2. As such, when the liquid composition droplets 110e to 110g are dropped in order to form the light-emitting layers 110b1 to 110b3 corresponding to the respective colors, each of the plurality of ejection heads in which the liquid compositions for the respective colors are filled is independently scanned and the liquid composition droplets 110e to 110g may be disposed on the substrate 2. In addition, the plurality of ejection heads are simultaneously scanned, so that the liquid compositions 110e to 110f can be disposed at the almost same time.

As shown in FIG. 8, each of the liquid compositions 110e to 110g having been ejected is dispersed on the hole injecting/carrying layer 110a, and is filled in the lower and upper openings 112c and 112d. Even when the ejection location of each of the liquid compositions 110e to 110g deviates from the predetermined ejection location so as to be ejected onto the top surface 112f, the top surface 112f having been subjected to the lyophobic treatment does not become wet by each of the liquid composition droplets 110e to 110g, and each of the liquid composition droplets 110e to 110g move into the lower and upper openings 112c and 112d.

The amount of liquid composition ejected onto each hole injecting/carrying layer 110a is determined by the size of each of the lower and upper openings 112c and 112d, the thickness of the light-emitting layer 110b to be formed, and a concentration of the forming material of the light-emitting layer contained in the liquid composition. In addition, each of the liquid composition droplets 110e to 110g may be ejected onto the hole injecting/carrying layer 110a once, and may be ejected on the hole injecting/carrying layer 110a many times. In this case, the amount of liquid composition in each ejection may be the same, and the amount of the liquid composition may be changed for each ejection. In addition, the liquid composition may be ejected onto the same place of the hole injecting/carrying layer 110a, or may be ejected onto a different place of the hole injecting/carrying layer 110a for each ejection.

Examples of the light-emitting layer forming material may include a polyfluorene-based polymer derivative, a (poly) paraphenylenevinylene derivative, a polyphenylene derivative, a polyvinylcarbazole, polythiophene derivatives, a perylene-based pigment, a coumarin-based pigment, a rhodamine-based pigment, or materials obtained by doping these polymeric materials with an organic EL material. For example, examples of the light-emitting layer forming material may include materials obtained by doping these polymeric materials with the materials, such as rubrene, perylene, 9, 10-diphenylanthracene, tetraphenylbutadiene, nile red, coumarin-6, quinacridone or the like. In addition, as a solvent for dissolving or dispersing the light-emitting layer forming material, the same solvent is used for a light-emitting layer of each color. In particular, a mixed solvent (trimethylbenzene: fluorobenzene=3:7 (volume ratio)) of trimethylbenzene and fluorobenzene (solvent containing fluorine group) is used.

In this case, for the liquid composition for forming the light-emitting layer (functional layer) 110b, since the mixed solvent containing the fluorine group is used as the solvent for dissolving or dispersing the light-emitting layer forming material, the flatness of the light-emitting layer 110b formed after the drying treatment increases markedly. That is, in the liquid composition using the mixed solvent, since the surface of the bank portion 112 having been subjected to the lyophobic treatment has a proper lyophobic property, the droplets are arranged in the bank portion 112. In contrast, in the liquid composition using the mixed solvent, since the surface of the bank portion 112 having been subjected to the lyophobic treatment has a little lyophilic property, the light-emitting layer 110b is suppressed or prevented from sinking near the bank portion 112 because of a surface tension between the light-emitting layer 110b and the bank portion 112 (the light-emitting layer 110b sags at the periphery of the bank portion 112). As a result, the flatness of the light-emitting layer 110b increases markedly.

In addition, examples of the solvent containing fluorine group may include benzotrifluoride having larger valence of fluorine than fluorobenzene, fluorotoluene, bis(4-fluorophenyl)ether, fluoroxylene, 4-fluoro-α-methylstyrene, 1-(4-fluoro-1-methylphenyl)-3,3,5-5-tetramethyl-cyclohexane, fluoroaniline, fluoroanisole, or the like, in addition to fluorobenzene.

In addition, preferably, the solvent containing the fluorine group is contained in the entire mixed solvent within a range of 10 to 50 percent by volume. In a case in which the volume content of the solvent containing the fluorine group is less than 10 percent by volume, the lyophobic property with respect to the bank portion 112 excessively increases, so that the flatness of the light-emitting layer 110b to be formed becomes lowered. In contrast, in a case in which the volume content of the solvent containing the fluorine group exceeds 50 percent by volume, the lyophilic property with respect to the bank portion 112 excessively increases, so that the light-emitting layer 110b to be formed sags along the bank portion 112, and a concave portion can be easily formed in the center portion of the pixel. As a result, the flatness becomes lowered.

Figure 9:
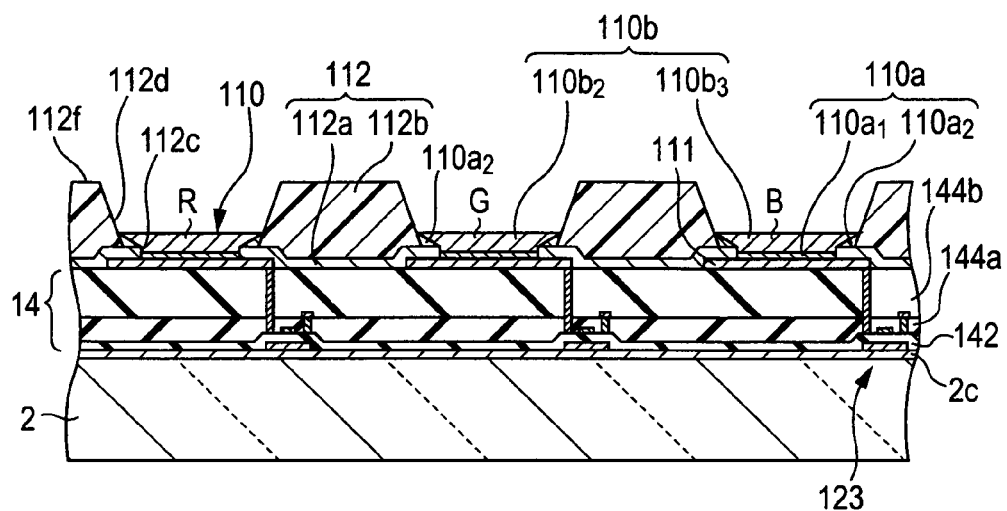
FIG. 9 is a diagram illustrating a process of a manufacturing method according to the embodiment.

Next, after each of the liquid compositions 110e to 110g for respective colors is disposed at a predetermined location, all of the liquid compositions are subjected to the drying treatment at the same time, and the light-emitting layers 110b1 to 110b3 are formed. That is, the solvent contained in each of the liquid compositions 110e to 110g is evaporated by means of the drying treatment, and a red (R) light-emitting layer 110b1, a green (G) light-emitting layer 110b2, and a blue (B) light-emitting layer 110b3 shown in FIG. 9 are formed. In addition, in FIG. 9, one red light-emitting layer emitting red light, one green light-emitting layer emitting green light, and one blue light-emitting layer emitting blue light are shown. However, a plurality of light-emitting elements are disposed in a matrix, as can be apparent from FIG. 1 or the like. A plurality of light-emitting layers (corresponding to respective colors) are formed, which are not shown.

In addition, it is preferable that the drying of the liquid composition of the light-emitting layer be performed by means of the vacuum drying. Specifically, the drying treatment can be performed with a pressure of 133.3 Pa (1 Torr) at a room temperature in a nitrogen atmosphere. If the pressure is excessively low, since the liquid composition may bump, it is not preferable. In addition, if the temperature is more than the room temperature, the evaporation speed of the solvent increases, so that a large amount of light-emitting layer forming materials may adhere on the wall surface of the upper opening 112d. It is not preferable.

Next, if the vacuum drying treatment is completed, preferably, the light-emitting layer 110b is subjected to an annealing treatment using the heating unit such as a hot plate or the like. The annealing treatment is performed at the normal temperature and time that can implement the light-emitting characteristic of each of the organic EL layers at the maximum.

In this way, the hole injecting/carrying layer 110a and the light-emitting layer 110b are formed on the pixel electrode 111.

Cathode Forming Process

Figure 10:
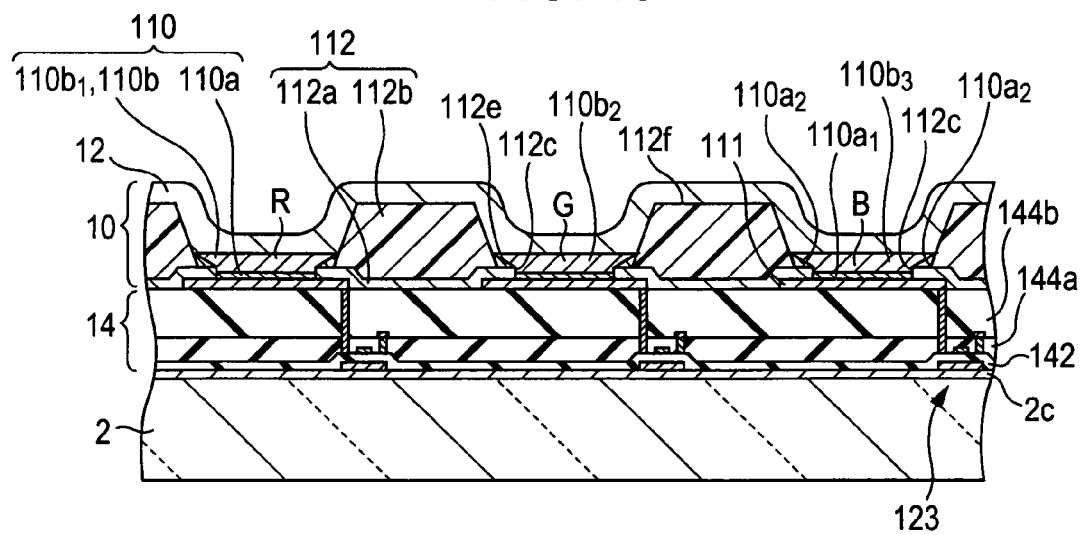
FIG. 10 is a diagram illustrating a process of a manufacturing method according to the embodiment.

Next, as shown in FIG. 10, the cathode 12 forming a pair together with the pixel electrode (anode) 111 is formed. That is, the cathode 12 having the structure in which a calcium layer and an aluminum layer are sequentially laminated on the entire surface of the region including the light-emitting layers 110b for respective colors and the organic bank layers 112b above the substrate 2. Thereby, the cathode 12 is laminated on the entire region of the light-emitting layers 110b for respective colors, and the organic EL elements corresponding to the respective colors of red, green, and blue are formed.

Preferably, the cathode 12 is formed by means of, for example, a deposition method, a sputtering method, a CVD method or the like. More preferably, the cathode 12 is formed by means of the deposition method so as to prevent the light-emitting layer 110b from being damaged due to the heat. In addition, a protective layer made of $SiO_2$, SiN or the like may be provided on the cathode 12 in order to prevent the oxidation.

Sealing Treatment

Finally, the substrate 2 where the organic EL element is formed and the sealing substrate which is separately arranged are bonded by means of the sealing resin. For example, the sealing resin, which is made of a thermosetting resin or the ultraviolet-curable resin, is coated on the peripheral portion of the substrate 2, and the sealing substrate is disposed on the sealing resin. It is preferable that the sealing treatment be performed in an inert gas atmosphere, such as nitrogen, argon, helium or the like. If the sealing treatment is performed in the atmosphere, since water or oxygen permeates into the cathode 12 from a defective portion when a defect such as a pinhole occurs in the cathode 12, it is not preferable.

After that, the cathode 12 is connected to the wiring line of the substrate 2, and the wiring line of the circuit element unit 14 is connected to the driving IC (driving circuit) provided on the substrate 2 or at the outside, so that the organic EL device according to the present embodiment is completed.

If using the above-mentioned manufacturing method, since the solvent forming the used liquid composition contains the solvent containing the fluorine group, the bank portion 112 has the extreme lyophobic property. As a result, the flatness of the surface of the light-emitting layer 110b to be formed increases markedly, and the light-emitting characteristic of the organic EL device can be markedly improved.

In the present embodiment, the mixed solvent containing the fluorine group-containing solvent is used in the liquid composition, but a different method can be used in order to improve the flatness of the light-emitting layer 110b. That is, after forming the light-emitting layer without containing the fluorine group-containing solvent in the liquid composition in the light-emitting layer forming process, the light-emitting layer to be formed is dissolved again in the solvent (mixed solvent) containing the fluorine group-containing solvent, and is then dried again. As a result, it is possible to form the light-emitting layer 110b having high flatness of the surface.

Specifically, in the same manner as the above, after (1) the bank portion forming process, (2) the bank portion surface treatment process, and (3) the hole injecting/carrying layer forming process, in (4) the light-emitting layer forming process, the solvent which does not contain the fluorine group-containing solvent, that is, the trimethylbenzene is used as the solvent of the liquid composition, is ejected by means of the inkjet method, and is dried. In addition, the light-emitting layer to be formed is dissolved again by the mixed solvent of fluorobenzene and/or benzotrifluoride and trimethylbenzene and is then dried. As a result, it is possible to form the light-emitting layer 110b having high flatness by means of the same process.

In the present embodiment, when the light-emitting layer 110b is formed, the fluorine group-containing solvent is used. However, even when the hole injecting/carrying layer 110a is formed, the fluorine group-containing solvent can be used, and it is possible to form the hole injecting/carrying layer 110a having high flatness.

Until now, the method of manufacturing the organic EL device has been described, but the above-mentioned method can be applied to a case in which other devices are manufactured like a color filter in which a plurality of coloring material layers are disposed for each partition wall (bank portion) or the wiring pattern formed for each partition wall (bank portion). In these devices, it is possible to obtain the effect that can improve the flatness of the coloring material layer or the wiring line to be formed. Hereinafter, a method of manufacturing the color filter will be described as an example of a method of manufacturing the device.

Method of Manufacturing Device

In a manufacturing process of the color filter CF shown in FIG. 15, that is, a manufacturing process of the color filter CF where a plurality of coloring material layers R, G, and B are disposed for the respective bank portions 112, the coloring material layers R, G, and B can be formed by means of an inkjet method using the fluorine group-containing solvent.

Specifically, after forming the bank portion 112 on the substrate 20 using the same method as the method of manufacturing the organic EL device, the surface treatment is performed in the same manner. In addition, the material (R forming material) for forming the coloring material layer R is dissolved or dispersed using the mixed solvent containing the fluorine group-containing solvent, that is, trimethybenzene containing fluorobenzene, and the liquid composition is formed. The liquid composition is selectively ejected onto a predetermined region (R forming region) surrounded by the bank portion 112 by means of the inkjet method. Next, with respect to the coloring material layer G and the coloring material layer B, the G forming material and the B forming material are dissolved and dispersed by means of the mixed solvent, the liquid composition is formed, and the formed liquid composition is selectively ejected onto the remaining predetermined region (G forming region and B forming region) by means of the inkjet method. After that, the solvent is collectively dried, each of the coloring material layers R, G, and B is formed, and the corresponding color filter CF is manufactured.

In addition, even at the time of manufacturing the color filter, a method can be used in which the coloring material layer is dissolved again by the solvent containing the fluorine group-containing solvent and is then dried again after the coloring material layer is formed. Even when any method is used, it is possible to manufacture the color filter with high flatness of each of the coloring material layers R, G, and B and small color irregularities.

Electronic Apparatus

FIG. 16 illustrates a first embodiment of an electronic apparatus using an organic EL device which is manufactured by the method according to the embodiment of the invention. The electronic apparatus according to the present embodiment includes as a display unit the organic EL device (shown in FIG. 1) which is manufactured by the above-mentioned method. FIG. 16 is a perspective view illustrating an example of the cellular phone. In FIG. 16, a reference numeral 1000 indicates a main body of the cellular phone, and a reference numeral 1001 indicates a display unit using the organic EL device 1. In the electronic apparatus having the above-mentioned organic EL device as the display unit, it is possible to achieve the excellent display characteristic.

Embodiments

Figure 11:
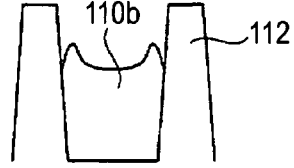
FIG. 11 is a diagram illustrating a shape of a light-emitting layer of each of the organic EL devices according to a first to fourth embodiments and a first comparison example.
Figure 11:
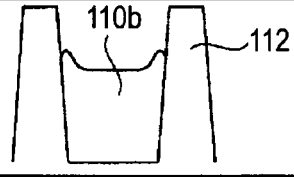
Figure 11:
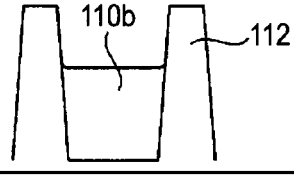
Figure 11:
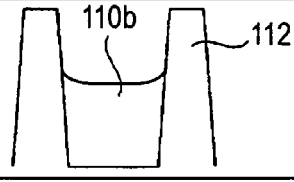
Figure 11:
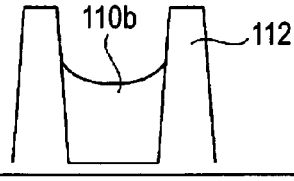

Hereinafter, the embodiments and the comparison examples have been examined in order to confirm the effect according to the aspects of the invention. That is, in the light-emitting layer forming process illustrated in the above-mentioned embodiments, the different solvent is used in each case, and the organic EL device according to each of the embodiments and the comparison examples has been manufactured. As shown in FIG. 11, the organic EL device according to each of the first comparison example and the first to fourth embodiments has been manufactured using the solvent in which the composition ratio (volume ratio) of fluorobenzene and trimethybenzene is different.

As shown in FIG. 11, in each of the organic EL devices which have been manufactured, the film shape of the light-emitting layer 110b is observed by the microscope, and a film maximum height y and a film minimum height x are calculated, as shown in FIGS. 12A and 12B. FIG. 12A illustrates a shape where the film surface of the light-emitting layer 110b sags near the pixel (near the bank), rises at the inner side, and a concave portion is formed in the center of the pixel. FIG. 12B illustrates a shape where the film surface of the light-emitting layer 110b does not sag near the pixel (near the bank).

In the light-emitting layer 110b according to each of the first to fourth embodiments, the flatness increases markedly as compared with the light-emitting layer 110b according to the first comparison example. That is, in the first comparison example, the sag occurs near the bank portion 112, each of x and y has a large value. However, in the light-emitting layer 110b according to each of the first to fourth embodiments, the sag is slightly generated. Therefore, each of x and y has a small value.

As shown in FIG. 13, the organic EL device according to each of the second comparison example and the fifth and sixth embodiments has been manufactured using the solvent in which the composition ratio (volume ratio) of benzotrifluoride and trimethybenzene is different. As shown in FIG. 13, in each of the organic EL devices which have been manufactured, the film shape of the light-emitting layer 110*b* is observed by the microscope, and a film maximum height y and a film minimum height x are calculated, as shown in FIGS. 12A and 12B.

In the light-emitting layer 110*b* according to each of the fifth and sixth embodiments, the flatness increases markedly as compared with the light-emitting layer 110*b* according to the second comparison example. That is, in the second comparison example, the sag occurs near the bank portion 112, each of x and y has a large value. However, in the light-emitting layer 110*b* according to each of the fifth and sixth embodiments, the sag is slightly generated. Therefore, each of x and y has a small value.

Further, the organic EL device (seventh embodiment) in which after forming the light-emitting layer using a solvent which does not contain the fluorine group-containing solvent, that is, the trimethylbenzene, the solvent is dissolved again using the fluorine group-containing solvent, and is then dried again, and the light-emitting layer 110*b* is formed, and the organic EL device (first comparison example) in which the dissolving and drying are not performed again are formed. As shown in FIG. 14, in the organic EL device according to each of the seventh embodiment and the third comparison example, the film shape of the light-emitting layer 110*b* is observed by the microscope, and a film maximum height y and a film minimum height x are calculated, as shown in FIGS. 12A and 12B.

In the light-emitting layer 110*b* according to the seventh embodiment, the flatness increases markedly as compared with the light-emitting layer 110*b* according to the third comparison example. That is, in the third comparison example, the sag occurs near the bank portion 112, each of x and y has a large value. However, in the light-emitting layer 110*b* according to the seventh embodiment, the sag is slightly generated. Therefore, each of x and y has a small value.

What is claimed is:

1. A method of manufacturing an organic electroluminescent device comprising:
    forming partition walls partitioning pixels on a substrate;
    subjecting a surface of each of the partition walls to a lyophobic treatment;
    coating a liquid composition on each of regions surrounded by the partition walls, the liquid composition obtained by dissolving or dispersing a forming material of a functional layer forming at least a portion of an organic electroluminescent element in a solvent that does not contain a fluorine group-containing solvent;
    drying the coated liquid composition so as to form the functional layer by means of vacuum drying;
    dissolving the functional layer with a solvent containing the fluorine group-containing solvent, the solvent being a liquid solvent that contacts the functional layer; and
    drying the dissolved functional layer to form the functional layer by means of the vacuum drying again,
    wherein the fluorine group-containing solvent includes at least one of fluorobenzene, fluorotoluene, benzotrifluoride, bis(4-fluorophenyl)ether, fluoroxylene, 4-fluoro-α-methylstyrene, 1-(4-fluoro-1-methylphenyl)-3,3,5-5-tetramethyl-cyclohexane, fluoroaniline, and fluoroanisole.

2. A method of manufacturing a device comprising:
    forming partition walls partitioning predetermined regions on a substrate;
    subjecting a surface of each of the partition walls to a lyophobic treatment;
    coating a liquid composition on each of regions surrounded by the partition walls, the liquid composition obtained by dissolving or dispersing a forming material of a functional layer forming at least a portion of the device in solvent that does not contain a fluorine group-containing solvent;
    drying the coated liquid composition so as to form the functional layer by means of vacuum drying;
    dissolving the functional layer with a solvent containing the fluorine group-containing solvent, the solvent being a liquid solvent that contacts the functional layer; and
    drying the dissolved functional layer to form the functional layer by means of the vacuum drying again,
    wherein the fluorine group-containing solvent includes at least one of fluorobenzene, fluorotoluene, benzotrifluoride, bis(4-fluorophenyl)ether, fluoroxylene, 4-fluoro-α-methylstyrene, 1-(4-fluoro-1-methylphenyl)-3,3,5-5-tetramethyl-cyclohexane, fluoroaniline, and fluoroanisole.

* * * * *